(12) United States Patent
Kirsch

(10) Patent No.: US 7,917,191 B2
(45) Date of Patent: Mar. 29, 2011

(54) METHOD FOR GENERATION OF AN IMAGE IN CONTRAST AGENT-SUPPORTED MR ANGIOGRAPHY AND MAGNETIC RESONANCE APPARATUS

(75) Inventor: Rainer Kirsch, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 601 days.

(21) Appl. No.: 11/924,798

(22) Filed: Oct. 26, 2007

(65) Prior Publication Data

US 2008/0103386 A1    May 1, 2008

(30) Foreign Application Priority Data

Oct. 27, 2006   (DE) .......................... 10 2006 050 887

(51) Int. Cl.
 *A61B 5/05* (2006.01)
(52) U.S. Cl. ........ 600/410; 600/407; 600/419; 600/420; 382/131

(58) Field of Classification Search ........................ None
See application file for complete search history.

(56) References Cited

U.S. PATENT DOCUMENTS

| 6,408,201 | B1 | 6/2002 | Foo et al. |
| 6,556,856 | B1 | 4/2003 | Mistretta et al. |
| 6,891,374 | B2 * | 5/2005 | Brittain .................. 324/309 |
| 2004/0027124 | A1 | 2/2004 | Abe et al. |
| 2005/0033159 | A1 | 2/2005 | Mistretta et al. |

* cited by examiner

*Primary Examiner* — Unsu Jung
*Assistant Examiner* — Nicholas L Evoy
(74) *Attorney, Agent, or Firm* — Schiff Hardin LLP

(57) ABSTRACT

In a method and apparatus for generation of an image in contrast agent-supported magnetic resonance angiography, a first data set is generated during an arterial phase of a distribution of a contrast agent in a vessel system by scanning of a first central k-space region, a second data set is generated during an equilibrium phase of the distribution of the contrast agent in the vessel system by scanning a peripheral k-space region while omitting scanning of a second central region, and the image is generated by merging the first data set and the second data set.

9 Claims, 4 Drawing Sheets

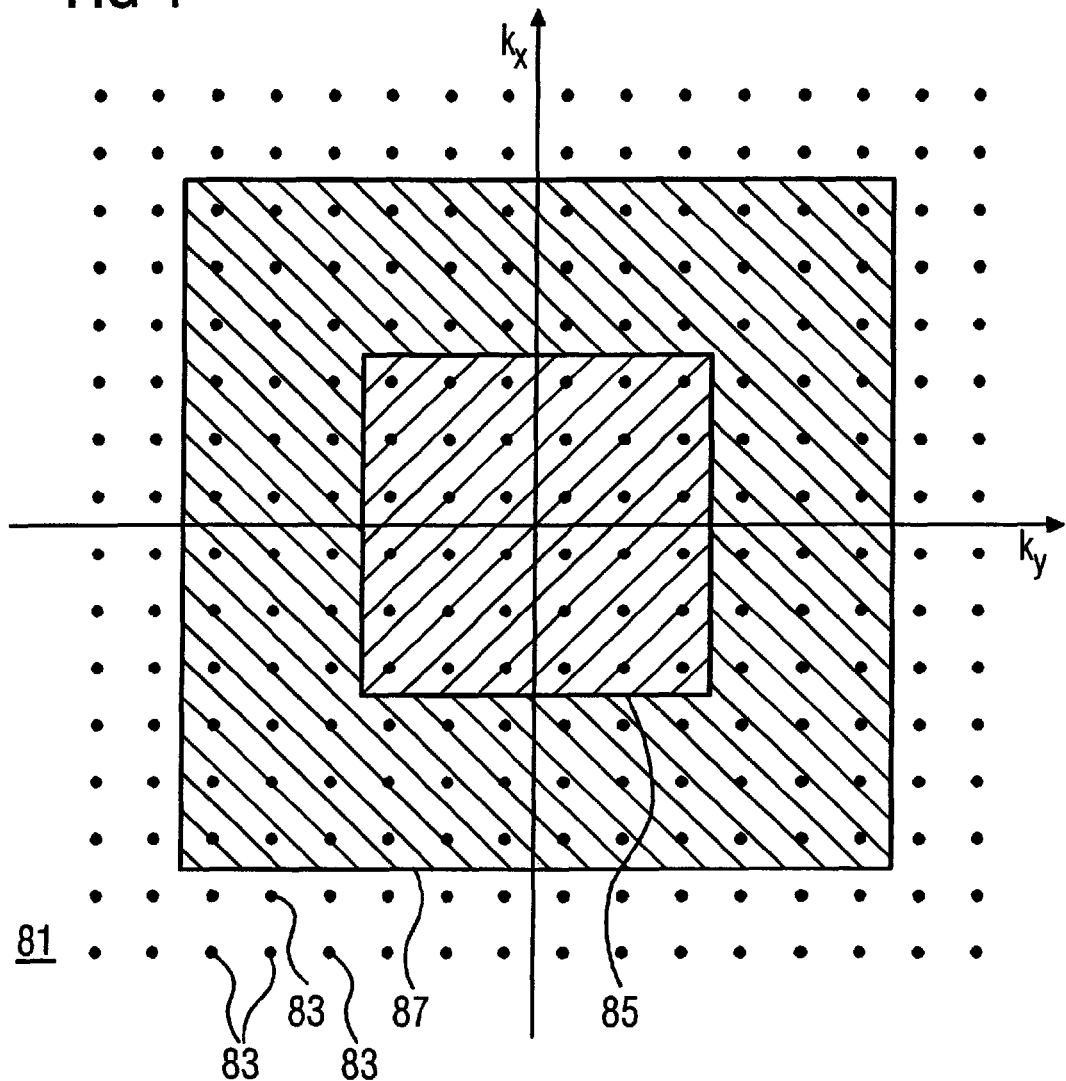

METHOD FOR GENERATION OF AN IMAGE IN CONTRAST AGENT-SUPPORTED MR ANGIOGRAPHY AND MAGNETIC RESONANCE APPARATUS

BACKGROUND OF THE INVENTION

1. Field of the Invention

The present invention concerns a method for generation of an angiographic image using magnetic resonance technology in which the contrast of vessel structures is intensified by a contrast agent. The invention also concerns a magnetic resonance apparatus for implementing such a method.

2. Description of the Prior Art

Magnetic resonance technology has been increasingly used for generation of angiographic images since, relative to other medical imaging methods (such as, for example, radioscopy with x-rays or computed tomography) it exhibits, among other things, the advantage that patient and medical personnel are subject to no radiation exposure.

Magnetic resonance (MR) technology is a known technique with which images of the inside of an examination subject can be generated. The examination subject is positioned in a comparably strong, static, homogeneous basic magnetic field (field strength of 0.2 Tesla to 7 Tesla and more) in an MR apparatus so that the nuclear spins in the object become oriented along the basic magnetic field. To excite nuclear magnetic resonances, radio-frequency excitation pulses are radiated into the examination subject, the excited nuclear magnetic resonances are measured and MR images are reconstructed based on these nuclear magnetic resonances. For spatial coding of the measurement data, rapidly-switched gradient fields are superimposed on the basic magnetic field. The acquired measurement data are digitized and stored as complex number values in a k-space matrix. An MR image can be reconstructed by a multi-dimensional Fourier transformation from the k-space matrix populated with such data values.

Since MR enables a soft tissue contrast that can be adjusted in many ways, it is also used in angiography since the imaged contrast can be selected such that vessel structures can be made differentiable from surrounding tissue. In order to increase the diagnostic significance of MR angiogram, a contrast agent (for example based on gadolinium) is often used. The contrast agent is injected into a vessel system of a patient so that it highlights the vessel system relative to surrounding tissue after subsequent propagation.

The propagation speed of the contrast agent depends on the vessel system to be examined and on the pathologies present therein. When the contrast agent diffuses, it is primarily located in arterial vessels during a first phase (known as the arterial phase) while venous vessels are not yet filled with the contrast agent. Only in a second phase (known as the equilibrium phase) has the contrast agent distributed enough so that it is located both in the arteries and in the veins of the vessel system. The arterial phase typically lasts some seconds until it is replaced by the equilibrium phase.

An angiography image in which both the arterial portion and the venous portion of the vessel system are imaged in a comparable manner is typically hard for a user to assess with regard to detecting pathologies, since the superimposition of arterial and venous structures often makes the pathologies to be detected unrecognizable. In the production of an angiogram it is therefore typically insured to that either purely arterial images or purely venous images are generated.

Given the generation of an angiogram by contrast agent-supported MR technology, a further problem occurs in the representation of the arterial phase. Since the MR technique requires relatively long image data acquisition times that can exceed the duration of the arterial phase of the contrast agent passage, it is often not possible to be able to complete the acquisition of the measurement data within the arterial phase, such that various methods exist that divide the measurement data to be acquired in different ways.

U.S. Pat. No. 6,556,856 discloses a method for generation of a time-resolved MR angiogram in which a time-resolved series of MR images with low resolution is acquired during the arterial phase and high-resolution MR images are acquired in the subsequent equilibrium phase. Low resolution and high resolution MR images are combined after subsequent segmentation of the low resolution temporal series of MR images and the high resolution MR images. The segmentation of the low resolution MR images ensues by a comparison of the temporal intensity curve of individual voxels of the low resolution series of MR images relative to their contrast ratio, using reference curves whose determination in turn requires a manual intervention of a user. In total the method requires both a manual intervention by a user and elaborate post-processing steps after an acquisition of the measurement data. The need therefore exists to further improve contrast agent-supported MR angiography methods.

SUMMARY OF THE INVENTION

An object of the invention is to provide a method for generation of an image in a contrast agent-supported MR angiography that enables a fast, simple and automatic implementation and with which an MR image can be generated in which arteries and veins are presented simultaneously such that they can be differentiated from one another. Furthermore, it is an object of the invention to provide a magnetic resonance apparatus with which a simple, fast and automatic method for generation of MR images can be implemented, whereby both veins and arteries are presented such that they can be differentiated in the MR images.

This object is achieved by a method for generation of an image in a contrast agent-supported magnetic resonance angiography including the steps of generating a first data set during an arterial phase of a distribution of a contrast agent in a vessel system by scanning a first central k-space region, generating a second data set during an equilibrium phase of the distribution of the contrast agent in the vessel system by scanning a peripheral k-space region while omitting a second central region from this scanning, and generating the image by merging the first data set and the second data set.

Various known MR angiography sequences such as, for example, a flash 3D sequence (Engl.: "Fast Low Angle Shot") can be used for scanning the k-space regions.

The first central k-space region that is scanned for generation of the first data set is dimensioned such that the scanning ends before the contrast agent has reached the venous portion of the vessel system. The possible size of the first central k-space region to be scanned thereby depends on various factors such as, for example, the scanning speed of the measurement sequence used and the duration of the arterial phase, which depends on the portion of the vessel system to be examined and the flow speed of the blood dependent thereupon.

During the equilibrium phase, which typically lasts significantly longer than the arterial phase, a second data set is acquired in which only peripheral k-space regions are scanned without a second central region being scanned.

In an image generated from the first data set the arteries are presented filled with contrast agent. The images generated with the first data set exhibit a relatively low spatial resolution since only low-frequency spatial frequencies have been sampled. In contrast to this, the second data set enables an image with high resolution to be generated. In the second data set only high spatial frequencies are present (since the second central region has been omitted in the acquisition of the second data set), but contrast agent-filled vessels are primarily represented by their wall region since the contrast agent-filled vessels here exhibit a sharp contrast transition, thus a high proportion of high spatial frequencies.

After merging of the two data sets, an image is reconstructed in which arteries exhibit a high contrast since they were filled with contrast agent during the scanning of the first central region and exhibit a high resolution since they were filled with contrast agent during the scanning of the second peripheral region, and veins are presented merely as hollow bodies with a high resolution wall region since they were filled with contrast agent during the scanning of the peripheral region but not during the scanning of the first central region.

Both veins and arteries are presented such that they can be differentiated in the generated image.

The merging of the first data set and the second data set can occur both in k-space before a Fourier transformation and in three-dimensional space after a Fourier transformation of the respective data sets, and is advantageously implemented automatically so that no interaction by a user is necessary.

In an advantageous embodiment the first data set and the second data set are merged in k-space into a combined data set in the generation of the image. The merged data set is subsequently Fourier-transformed. The first data set and the second data set in k-space are advantageously merged into a combined data set immediately after their generation. In this context "immediately" means without implementation of further processing steps (such as, for example, segmentations or maskings).

In another embodiment, for the generation of the image, the first data set and the second data set are respectively Fourier-transformed into a first partial image and a second partial image and subsequently are merged into the image. The first partial image and the second partial image are merged into the image immediately after the Fourier transformation. Here as well "immediately" means without implementation of further processing steps (such as, for example, segmentations or maskings).

In this manner the method can be automated very quickly and simply without elaborate intermediate operations given simultaneous generation of an image in which both arteries and veins are shown and can be differentiated from one another.

The first central region preferably corresponds with the second central region. This ensures that k-space is scanned nearly seamlessly, but k-space regions are scanned twice.

In a further embodiment of the a mask is generated from the first data set and in that an automatic segmentation of the generated image ensues using the mask. The difference between arteries and veins again emerges more clearly due to the segmentation of the generated image. Arteries and veins also exist separate from one another in the data set due to the segmentation, such that further evaluation algorithms can build on this.

The above object also is achieved in accordance with the present invention by a magnetic resonance angiography apparatus that implements the method described above, as well as all embodiments thereof.

BRIEF DESCRIPTION OF THE DRAWINGS

FIG. 4 illustrates an example of a segmentation of k-space in a central region and a peripheral region.

DESCRIPTION OF THE PREFERRED EMBODIMENTS

Figure 1:
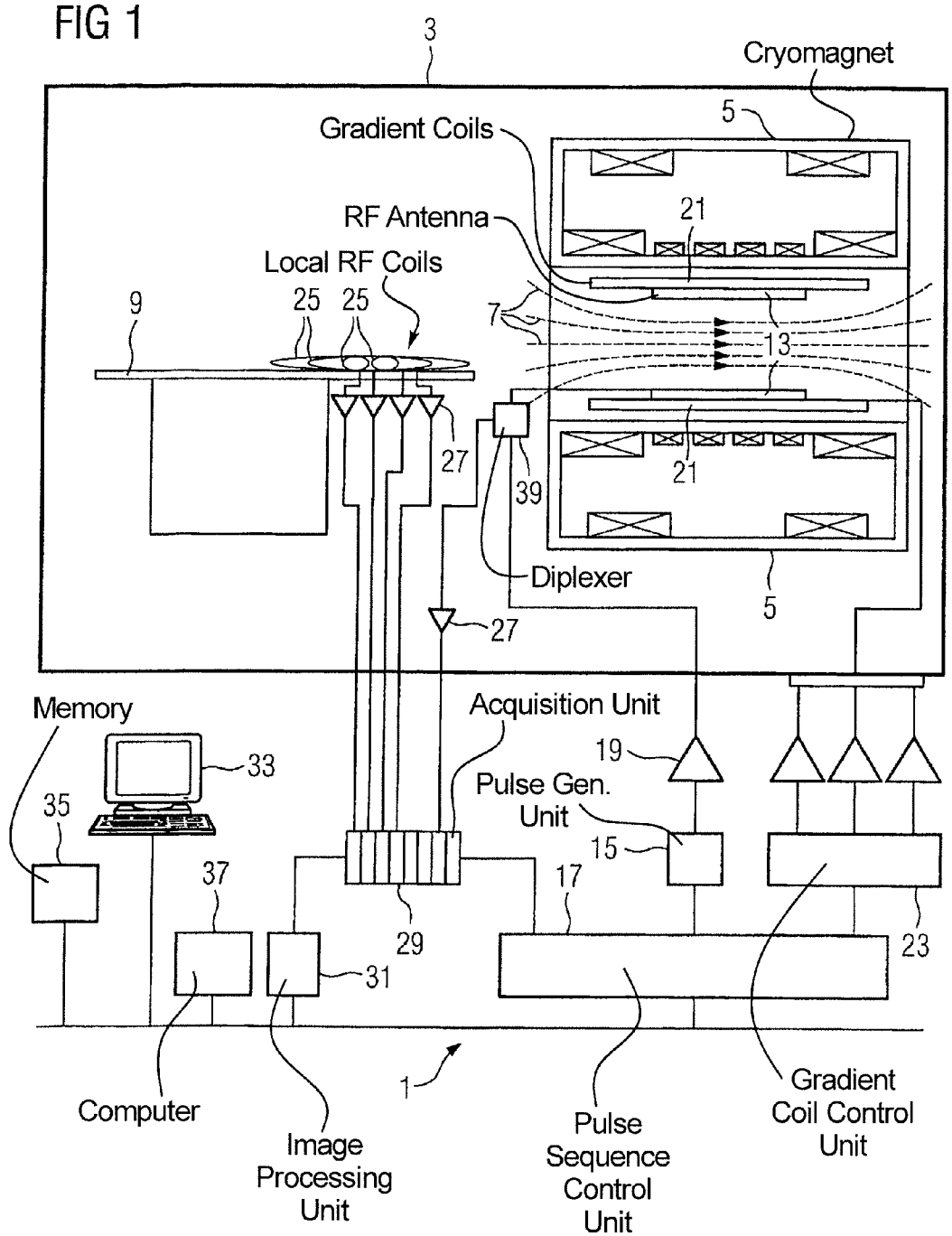
FIG. 1 schematically illustrates an MR apparatus for implementing the inventive method.

FIG. 1 schematically shows the design of a magnetic resonance apparatus 1 with its basic essential components. In order to examine a body by means of magnetic resonance imaging, various magnetic fields matched as precisely as possible to one another in terms of their temporal and spatial characteristics are applied.

A strong magnet (typically a cryomagnet 5 with a tunnel-shaped opening) arranged in a radio frequency-shielded measurement chamber 3 generates a strong, static basic magnetic field 7 that is typically 0.2 Tesla to 3 Tesla and more. A body or a body part (not shown here) to be examined is placed on a patient bed 9 and positioned in a homogeneous region of the basic magnetic field 7.

The excitation of the nuclear spins of the body ensues by radio-frequency excitation pulses that are radiated via a radio-frequency antenna (shown here as a body coil 13). The radio-frequency excitation pulses are generated by a pulse generator 15 that is controlled by a pulse sequence control unit 17. After an amplification in an radio-frequency amplifier 19, they are relayed to the radio-frequency antenna. The radio-frequency system shown here is only schematically indicated. Typically, more than one pulse generation unit 15, more than one radio-frequency amplifier 19, and a number of radio-frequency antennas are used in a magnetic resonance apparatus 1.

Furthermore, the magnetic resonance apparatus 1 has gradient coils 21 with which magnetic gradient fields for selective slice excitation and for spatial coding of the measurement signal are radiated in a data acquisition procedure. The gradient coils 21 are controlled by a gradient coil control unit 23 that, like the pulse generation unit 15, is connected with the pulse sequence control unit 17.

The signals emitted by the excited nuclear spins are received by the body coil 13 and/or by local coils 25, amplified by associated radio-frequency preamplifiers 27 and are further processed and digitized by an acquisition unit 29.

Given a coil that can be operated both in transmission mode and in reception mode (such as, for example, the body coil 13), the correct signal relaying is regulated by an upstream transmission-reception diplexer 39.

An image processing unit 31 generates from the measurement data an image that is presented to a user via an operator console 33 or is stored in a storage unit 35. A central computer 37 controls the individual system components. The computer 37 is thereby fashioned to implement the inventive method can be implemented with it.

Figure 2:
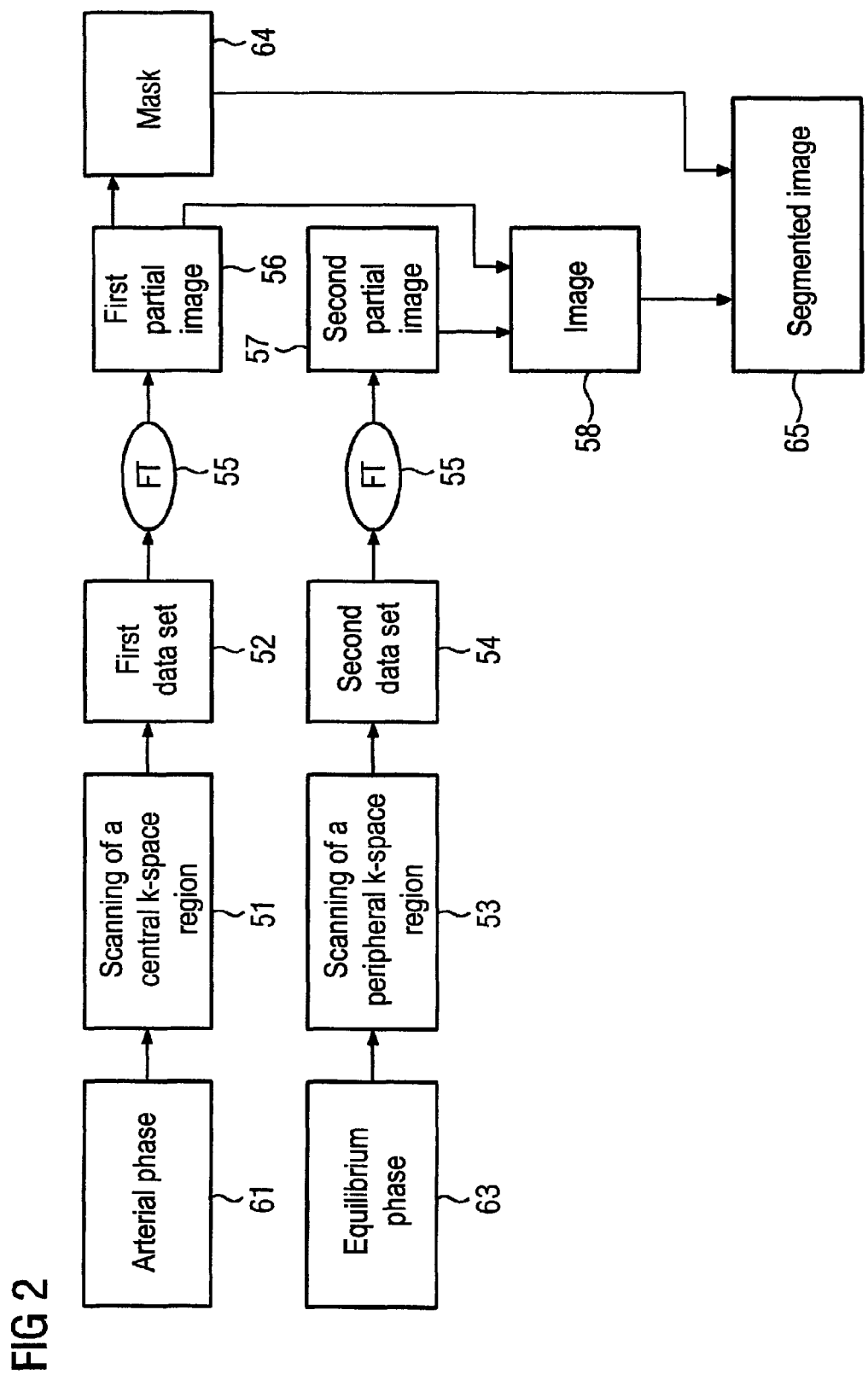
FIG. 2 is a schematic overview of an embodiment of the inventive method.

FIG. 2 shows a schematic overview of an embodiment of the inventive method.

For contrast agent-supported MR angiography a contrast agent is administered (most often intravenously) to a patient to be examined. After a specific wait time the contrast agent has propagated so far in the body of the patient that it is located in the arterial portion of a segment of the vessel system to be examined. At this point in time (i.e. during the arterial phase 61), a first scanning 51 of a central k-space region and the generation of a first data set 52 ensue in a first step.

After further propagation of the contrast agent, the contrast agent is located both in the arterial portion and in the venous portion of the vessel system. During this phase (also designated as an equilibrium phase 63), a second scanning 53 of a peripheral k-space region and the generation of a second data set 54 ensue in a second step. During the second scan 53 a further central k-space region is not scanned as well. The further central region which is not scanned as well in the second scan 53 is advantageously at least as large as the central region that has been scanned in the first scan 51. In this manner k-space is scanned without overlap by the two scans, which simplifies the merging of the two data sets. The two central k-space regions are in particular equally large, such that a contiguous k-space region is scanned without overlap (and oversampling arising therefrom) by the first and second scans 51, 53.

The first data set 52 and the second data set 54 are subsequently respectively Fourier-transformed in a Fourier transformation step 55 into a first partial image 56 and a second partial image 57 that are subsequently combined into an image 58.

The merging of the first partial image 56 and the second partial image 57 preferably ensues directly and immediately after the Fourier transformation, i.e. without intervening steps of a segmentation or other processing steps with which the two partial images 56, 57 are matched to one another, such that the image 58 is obtained in a simple and automatic manner.

In the generated image 58 both the arterial portion and the venous portion of the vessel system are presented since the high spatial frequencies have been acquired during the equilibrium phase 63 during which both arteries and veins were filled with contrast agent. Through the second data set 54 (in which only high spatial frequencies have been sampled), both the arteries and the veins are recognizable as structures represented primarily by their walls, without a filled-in lumen, for the representation of which the acquisition of lower spatial frequencies is necessary.

The lumen of contrast agent-filled vessels is thus also shown through the first data set 52 in which the low spatial frequencies have been acquired. Since the first data set 52 has been acquired during the arterial phase 61, only the lumen of arteries is shown. Arteries and veins thus differ in appearance in the generated image 58.

In a further embodiment, a mask 64 is created using the first data set 52 or the first partial image 56, for example by all voxels whose intensity value lies above a predetermined threshold being added to the mask 64. A mask 64 can also be created, for example, in which weighting factors are stored based on the intensity values of the voxels.

This mask is applied to the generated image 58 so that a segmentation of the generated image is hereby implemented and a segmented image 65 is thus created. Arteries and veins are thus again more clearly emphasized in the image. Automatic evaluation methods can also follow based on this segmentation, with which evaluation methods the geometric relationships of the vessel structures are evaluated and pathologies are discovered by comparison with standard values, for example.

Figure 3:
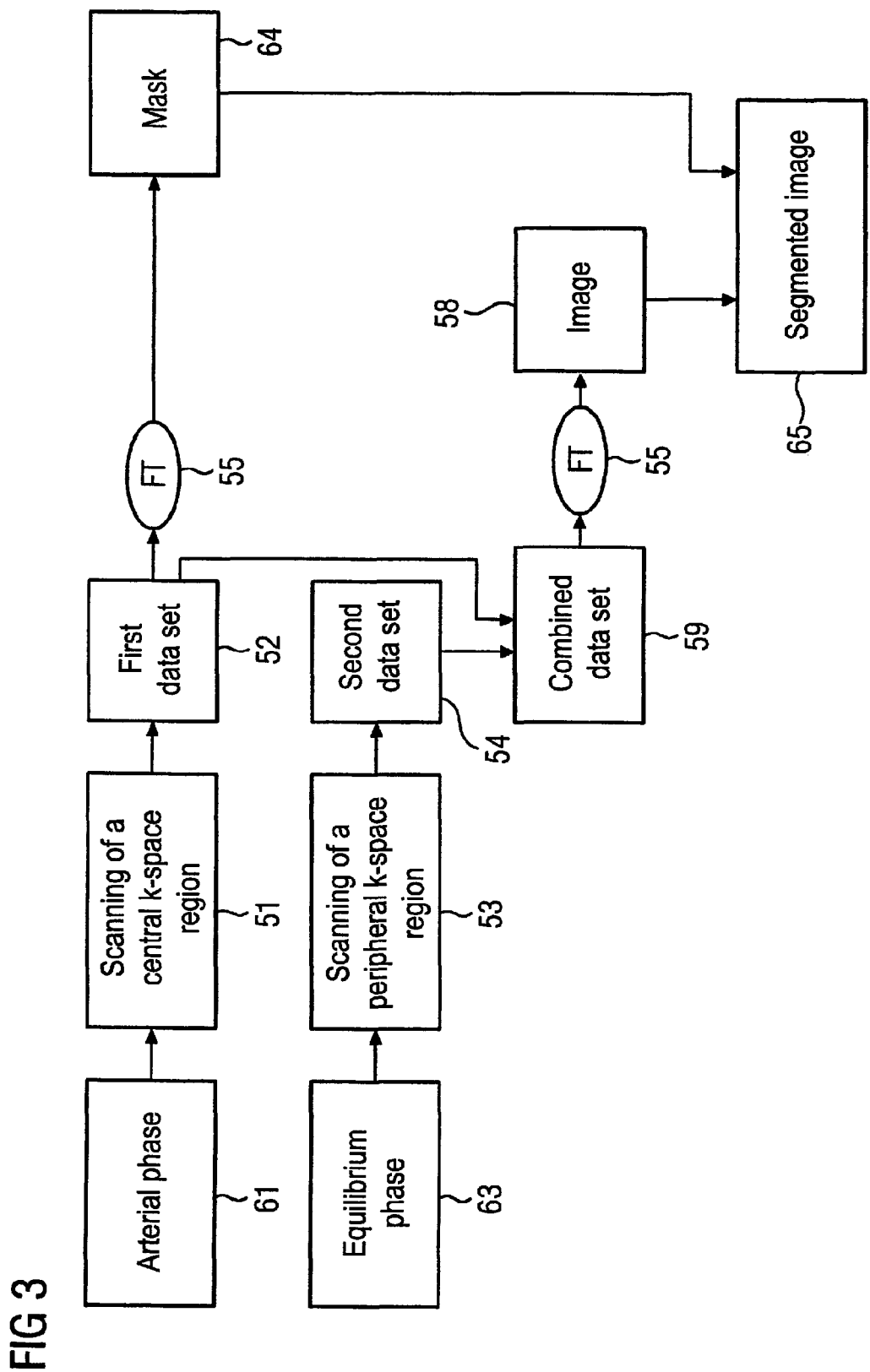
FIG. 3 is a schematic overview of a further embodiment of the inventive method.

FIG. 3 shows an overview of a further embodiment of the inventive method. In contrast to FIG. 2, the first data set 52 and the second data set 54 are hereby merged into a combined data set 59 and the image 58 is subsequently generated by a Fourier transformation. The merging ensues directly and immediately, i.e. without intermediate steps of a segmentation or other processing steps with which the first and second data sets 52, 54 are matched to one another.

FIG. 4 shows a possible division of three-dimensional k-space into a central region and a peripheral region.

Of three-dimensional k-space 81 in which k-space lines 83 are arranged on a Cartesian grid, here only the phase coding plane with two phase coding directions $k_x$ and $k_y$ are shown. The readout direction of the k-space lines 83 stands perpendicular to these, thus perpendicular to the plane of the drawing. This Cartesian arrangement of the k-space lines 83 is merely one possible arrangement of k-space lines 83 in k-space 81 and can be modified in various ways when this appears to be advantageous.

The central region 85 of k-space 81 is scanned in the generation of the first data set 52. The size of the central k-space region 85 is thereby tuned to the duration of the arterial phase 61 and to the scanning speed of the measurement sequence that is used for data acquisition, such that the scanning of the central k-space region 85 is completed during the arterial phase 61.

During an equilibrium phase 63 the peripheral data set 54 is scanned while omitting the central region 85, thereby scanning region 87. Since the equilibrium phase 63 typically lasts significantly longer than the arterial phase 61, significantly more k-space lines 83 can be scanned, such that high k-space frequencies are also acquired.

Although modifications and changes may be suggested by those skilled in the art, it is the intention of the inventor to embody within the patent warranted hereon all changes and modifications as reasonably and properly come within the scope of his contribution to the art.

I claim:

1. A method for generating an image in contrast agent-supported magnetic resonance angiography wherein data are entered into k-space, comprising the steps of:
    for a first data acquisition after injection of a contrast agent into the vessel system of an examination subject, designating a first central region of k-space, that leaves a first peripheral region of k-space and acquiring a first magnetic resonance data set from the subject during an arterial phase of distribution of the contrast agent in the vessel system by scanning only said first central region of k-space;
    for a second data acquisition following said first data acquisition, designating a second central region of k-space that leaves a second peripheral region of k-space and acquiring a second magnetic resonance data set from the subject during an equilibrium phase of distribution of the contrast agent in the vessel system by scanning said second peripheral k-space region while omitting scanning of said second central k-space region;
    generating a magnetic resonance image of the subject by merging said first data set and said second data set; and
    generating a mask for identification of arterial regions from said first data set, and automatically segmenting said image using said mask.

2. A method as claimed in claim 1 further comprising generating said magnetic resonance image by merging said first data set and said second data set in k-space into a combined data set in k-space, and Fourier transforming said combined data set to generate said image.

3. A method as claimed in claim 2 further comprising merging said first data set and said second data set in k-space into said combined data set immediately after acquiring said first data set and said second data set.

4. A method as claimed in claim 1 further comprising generating said image by Fourier transforming said first data set in k-space into a first partial image and Fourier transforming said second data set in k-space into a second partial image, and merging said first partial image and said second partial image to form said image.

5. A method as claimed in claim 4 further comprising merging said first partial image and second partial image to form said image immediately after Fourier transforming said first and second data sets.

6. A method as claimed in claim 1 further comprising designating said second central region of k-space to correspond to said first central region.

7. A method as claimed in claim 1 further comprising scanning only said first central k-space region by sampling only low-frequency spatial frequencies of said first magnetic resonance data set, and scanning said second peripheral k-space region while omitting scanning of said second central k-space region, by scanning only high-frequency spatial frequencies of said second magnetic resonance data set.

8. A magnetic resonance apparatus that implements an angiography procedure wherein data are entered into k-space, comprising:
   a contrast agent injector configured to interact with an examination subject to inject contrast agent into the vessel system of the examination subject;
   a magnetic resonance data acquisition system that implements a first data acquisition followed by a second data acquisition with a first central region of k-space being designated for said first data acquisition that leaves a first peripheral region of k-space, and with a second central region of k-space being designated for said second data acquisition that leaves a second peripheral region of k-space, said magnetic resonance data acquisition system being configured to interact with the examination subject to acquire, in said first data acquisition after injection of the contrast agent into the vessel system of an examination subject, said first magnetic resonance data set from the subject during an arterial phase of distribution of the contrast agent in the vessel system by scanning only a first central k-space region, and to acquire, in said second data acquisition, a second magnetic resonance data set from the subject during an equilibrium phase of distribution of the contrast agent in the vessel system by scanning said second peripheral k-space region while omitting scanning of said second central k-space region;
   a computer configured to operate a magnetic resonance image of the subject by merging said first data set and said second data set; and
   said computer being configured to generate a mask for identification of arterial regions from said first data set, and automatically segmenting said image using said mask.

9. A magnetic resonance apparatus as claimed in claim 8 wherein said magnetic resonance data acquisition system is configured to scan only said first central k-space region by scanning only low-frequency spatial frequencies of said first magnetic resonance data set, and to scan said second peripheral k-space region while omitting scanning of said second central k-space region by scanning only high-frequency spatial frequencies of said second magnetic resonance data set.

* * * * *